(12) United States Patent
Um et al.

(10) Patent No.: US 9,372,741 B2
(45) Date of Patent: Jun. 21, 2016

(54) DATA STORAGE DEVICE AND OPERATING METHOD THEREOF

(71) Applicant: SK hynix Inc., Gyeonggi-do (KR)

(72) Inventors: Gi Pyo Um, Gyeonggi-do (KR); Ju Yong Shin, Gyeonggi-do (KR); Jong Ju Park, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 147 days.

(21) Appl. No.: 14/055,465

(22) Filed: Oct. 16, 2013

(65) Prior Publication Data
US 2015/0039948 A1    Feb. 5, 2015

(30) Foreign Application Priority Data
Jul. 31, 2013   (KR) .................. 10-2013-0090960

(51) Int. Cl.
| | | |
|---|---|---|
| *G06F 11/16* | (2006.01) | |
| *G06F 12/00* | (2006.01) | |
| *G06F 11/07* | (2006.01) | |
| *G11C 29/00* | (2006.01) | |
| *G06F 11/20* | (2006.01) | |
| *G11C 29/04* | (2006.01) | |

(52) U.S. Cl.
CPC ........ *G06F 11/0706* (2013.01); *G06F 11/0793* (2013.01); *G11C 29/765* (2013.01); *G11C 29/82* (2013.01); *G06F 11/2094* (2013.01); *G11C 2029/0411* (2013.01)

(58) Field of Classification Search
CPC ... G06F 11/167; G06F 3/0679; G06F 12/023; G06F 11/2094; G06F 11/0706; G06F 11/0793; Y02B 60/1225; G11C 29/82; G11C 29/765
USPC ........ 714/710, 718; 365/185.33, 230.03, 200, 365/201; 711/E12.06, 170
See application file for complete search history.

(56) References Cited

U.S. PATENT DOCUMENTS

| | | | | |
|---|---|---|---|---|
| 6,134,610 | A * | 10/2000 | Chung | 710/55 |
| 6,678,787 | B2 * | 1/2004 | Petruschka | G06F 11/1471 707/999.202 |
| 7,324,415 | B2 * | 1/2008 | Fontijn | 369/47.15 |
| 7,613,871 | B2 * | 11/2009 | Tanaka | G06F 12/0246 711/103 |
| 7,849,253 | B2 * | 12/2010 | Stewart | G06F 11/1435 711/103 |
| 8,151,035 | B2 * | 4/2012 | Smith | G06F 3/0616 711/103 |
| 2006/0155921 | A1 * | 7/2006 | Gorobets | G06F 12/0246 711/103 |
| 2006/0155922 | A1 * | 7/2006 | Gorobets | G06F 12/0246 711/103 |
| 2006/0224818 | A1 * | 10/2006 | Stewart | G06F 12/0246 711/103 |
| 2006/0288153 | A1 * | 12/2006 | Tanaka et al. | 711/103 |

(Continued)

FOREIGN PATENT DOCUMENTS

KR   1020110104292   9/2011

*Primary Examiner* — Phung M Chung
(74) *Attorney, Agent, or Firm* — IP & T Group LLP

(57) ABSTRACT

A data storage device includes: a nonvolatile memory device comprising a plurality of memory blocks, each including a plurality of pages; and a controller suitable for controlling an operation of the nonvolatile memory device in response to a request from an external device, wherein the controller determines whether or not a memory block including damaged pages in which stored data are damaged occurs in the memory blocks, sets a memory block including the damaged pages to an invalid memory block based on the determination result, and regenerates free pages of the memory block set as the invalid memory block into a valid memory block.

20 Claims, 9 Drawing Sheets

(56) References Cited

U.S. PATENT DOCUMENTS

| | | | | |
|---|---|---|---|---|
| 2007/0028035 A1* | 2/2007 | Nishihara | ............ | G06F 12/0246 711/103 |
| 2008/0288717 A1* | 11/2008 | Torabi | ................. | G06F 12/0246 711/103 |
| 2009/0300276 A1* | 12/2009 | Torabi | ................. | G06F 12/0246 711/103 |
| 2010/0122015 A1* | 5/2010 | Fusella | ................ | G06F 12/0246 711/103 |
| 2010/0169543 A1* | 7/2010 | Edgington | .......... | G06F 12/0246 711/103 |
| 2012/0221776 A1* | 8/2012 | Yoshihashi et al. | ........... | 711/103 |
| 2013/0311707 A1* | 11/2013 | Kawamura et al. | ........... | 711/103 |

* cited by examiner

FIG.5

ADDRESS MAPPING TABLE

| LA | PAGE# (PA) | VP / IVP Flag |
|---|---|---|
| 110 | 0 | IVP |
| 114 | 1 | IVP |
| 118 | 2 | IVP |
| 122 | 3 | IVP |
|  | 4 | VP |
|  | 5 | VP |
|  | 6 | VP |
|  | 7 | VP |
|  | 8 | VP |
|  | 9 | VP |
| 110 | 303 | VP |
| 114 | 304 | VP |
| 118 | 305 | VP |
| 122 | 306 | VP |

ADDRESS MAPPING UPDATE

FIG.7

ADDRESS MAPPING TABLE

| LA | PAGE# (PA) | VP / IVP Flag |
|---|---|---|
| 110 | 303 | VP |
| 114 | 304 | VP |
| 118 | 305 | VP |
| 122 | 306 | VP |

...

| LA | PAGE# (PA) | VP / IVP Flag |
|---|---|---|
| 232 | 4 | VP |
| 236 | 5 | VP |
| 350 | 6 | VP |
| 300 | 7 | VP |
|  | 8 | VP |
|  | 9 | VP |

DATA STORAGE DEVICE AND OPERATING METHOD THEREOF

CROSS-REFERENCES TO RELATED APPLICATION

The present application claims priority under 35 U.S.C. §119(a) to Korean application number 10-2013-0090960, filed on Jul. 31, 2013, in the Korean Intellectual Property Office, which is incorporated herein by reference in its entirety.

BACKGROUND

1. Technical Field

Various exemplary embodiments relate to a data storage device, and more particularly, to a data storage device capable of recovering an invalid region and an operating method thereof,

2. Related Art

The recent paradigm for computer surroundings has changed to ubiquitous computing environments in which computer systems may be used anytime and anywhere. Thus, the use of portable electronic devices such as mobile phones, digital cameras, and notebook computers has rapidly increased. Such portable electronic devices generally use a data storage device using a memory device.

Since the data storage device using a memory device has no mechanical driver, the data storage device has excellent stability and durability. Furthermore, the data storage device has high access speed and small power consumption. The data storage device having such advantages includes a universal serial bus (USB) memory device, a memory card having various interfaces, and a solid state drive (SSD).

A host provides a logical address to access the data storage device. The data storage device converts the logical address into a physical address used in the data storage device, and performs a requested operation based on the physical address. For this address conversion operation, the data storage device may manage an address mapping table.

SUMMARY

Various exemplary embodiments are directed to a data storage device and an operating method thereof, which are capable of stabilizing the reliability of a invalid region and recovering the invalid region.

In an exemplary embodiment of the present invention, an operating method of a data storage device may include determining whether or not an invalid region occurs in memory regions, and setting a memory region to the invalid region based on the determination result, and regenerating free pages of the memory region set as the invalid region into a valid region.

In an exemplary embodiment of the present invention, a data storage device may include a nonvolatile memory device comprising a plurality of memory blocks, each including a plurality of pages, and a controller suitable for controlling an operation of the nonvolatile memory device based on a request from an external device. The controller determines whether or not a memory block including damaged pages in which stored data are damaged occurs in the memory blocks, sets a memory block including the damaged pages to an invalid memory block based on the determination result, and regenerates free pages of the memory block set as the invalid memory block into a valid memory block.

In an exemplary embodiment of the present invention, an operating method of a data storage device may include setting a memory block including one or more damaged pages in which stored data are damaged as an invalid block, determining whether the number of free pages in the invalid block is larger than or equal to a reference value, and regenerating the free pages of the invalid block into a valid block when the number of the free pages is larger than or equal to the reference value.

BRIEF DESCRIPTION OF THE DRAWINGS

Features, aspects, and embodiments are described in conjunction with the attached drawings, in which:

FIG. 5 illustrates an address mapping table for the invalid region of FIG. 4;

FIG. 7 illustrates an address mapping table for the regenerated region of FIG. 6;

DETAILED DESCRIPTION

Figure 1:
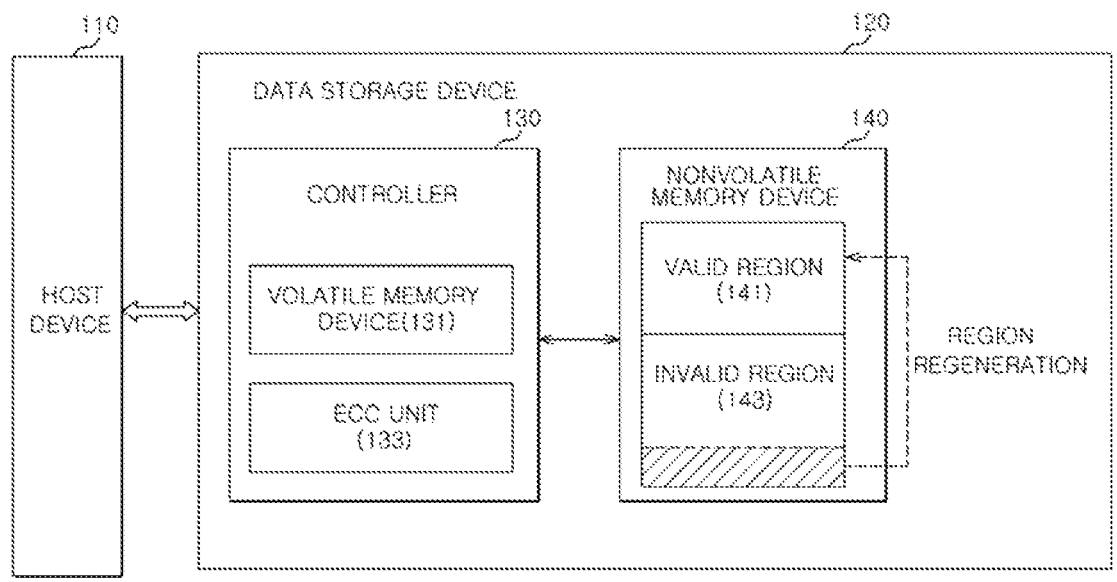
FIG. 1 is a block diagram illustrating a data processing system including a data storage device according to an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments. In this specification specific terms have been used. The terms are used to describe the embodiments of the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Hereafter, the exemplary embodiments of the present invention will be described with reference to the drawings.

FIG. 1 is a block diagram illustrating a data processing system including a data storage device according to an exemplary embodiment of the present invention.

Referring to FIG. 1, the data processing system 100 may include a host device 110 and a data storage device 120.

The host device 110 may include portable electronic devices such as mobile phones, MP3 players, digital camera and lap-top computers, or electronic devices such as desktop computers, game machines, TVs, projectors and vehicle entertainment systems.

The data storage device 120 may operate in response to a request from the host device 110. The data storage device 120 may store data accessed by the host device 110. That is, the data storage device 120 may serve as a storage device of the host device 110. The data storage device 120 may be referred to as a memory system. The data storage device 120 may be implemented with a memory card. The data storage device 120 may be implemented with a solid state drive (SSD). The data storage device 120 may be coupled to the host device 110 through various interfaces.

The data storage device 120 may include a controller 130 and a nonvolatile memory device 140. Furthermore, the controller 130 may include a volatile memory device 131 and an error correction code (ECC) unit 133.

The controller 130 may control overall operations of the data storage device 120. The controller 130 may execute firmware or software loaded into the volatile memory device 131, in order to control the overall operations of the data storage device 120.

The volatile memory device 131 may store firmware or software and data required for executing the firmware or software. That is, the volatile memory device 131 may operate as a working memory device. The volatile memory device 131 may temporarily store data to be transmitted from the host device 110 to the nonvolatile memory device 140, or transmitted from the nonvolatile memory device 140 to the host device 110. That is, the volatile memory device 131 may operate as a buffer memory device or cache memory device.

The ECC unit 133 may detect and correct an error of data read from the nonvolatile memory device 140. The ECC unit 133 may be implemented with hardware or software. Alternatively, the ECC unit 133 may be implemented with a combination of hardware and software.

The controller 130 may control the nonvolatile memory device 140 in response to the request from the host device 110. For example, the controller 130 may provide data read from the nonvolatile memory device 140 to the host device 110, and may store data provided from the host device 110 in the nonvolatile memory device 140. For this operation, the controller 130 may control read, program (or write), and erase operations of the nonvolatile memory device 140.

The nonvolatile memory device 140 may serve as a storage medium of the data storage device 120. The nonvolatile memory device 140 may include various types of nonvolatile memory devices such as a NAND flash memory device, a NOR flash memory device, a ferroelectric random access memory (FRAM) using a ferroelectric capacitor, a magnetic RAM (MRAM) using a tunneling magneto-resistive (TMR) layer, a phase change memory device (PRAM) using chalcogenide alloys, a resistive memory device (ReRAM) using transition metal oxide, and the like. The nonvolatile memory device 140 may be implemented with a combination of a NAND flash memory device and the above-described various types of the nonvolatile memory devices.

In the following descriptions a case in which the nonvolatile memory device 140 is implemented with a flash memory device 140 will be taken as an example. The flash memory device 140 may have a memory region divided into pages and blocks due to the structural characteristics thereof. For example, one memory block may include a plurality of pages. The flash memory device 140 performs a read or program operation in unit of pages. The flash memory device 140 performs an erase operation in unit of blocks. Furthermore, the flash memory device 140 may not perform an overwrite operation due to the structural characteristics thereof. That is, a memory cell of the flash memory device 140, in which data is stored, may store new data after erasing the data stored in the memory cell. Due to such characteristics of the flash memory device 140, the controller 130 may execute additional firmware referred to as a flash transition layer (FTL).

The FTL may manage read, program and erase operations of the flash memory device 140 so that the data storage device 120 operates in response to an access, e.g., read or write operation, requested from a file system of the host device 110. Furthermore, the FTL may manage incidental operations due to the characteristics of the flash memory device 140. For example, the FTL may manage a garbage collection operation, a wear-leveling operation, a bad block management operation, and the like.

When the host device 110 accesses the data storage device 120, for example, when the host device 110 requests a read operation or a write operation, the host device 110 provides a logical address to the data storage device 120. The controller 130 converts the logical address into a physical address used in the flash memory device 140, and performs the read operation or the write operation by referring to the physical address. For this address conversion operation, an address mapping table including address conversion data is required. The address mapping table may be managed by the FTL. While the data storage device 120 operates, the address mapping table may be loaded into the volatile memory device 131.

The memory region of the flash memory device 140 may include a valid region 141 and an invalid region 143. For example, the valid region 141 and the invalid region 143 may be configured in unit of blocks. The valid region 141 is where data provided from the host device 110 are normally stored. The valid region 141 may be mapped to a logical address through the address mapping table. The invalid region 143 is where data provided from the host device 110 may not be normally stored. That is, the invalid region 143 may be an error region. The invalid region 143 may not be mapped to a logical address through the address mapping table. The invalid region 143 may be excluded from address mapping.

For various reasons, any of memory regions included in the valid region 141 may be set (or changed) to the invalid region 143. For example, among the memory regions included in the valid region 141, a memory region in which stored data are damaged may be set as the invalid region 143. For example, among the memory regions included in the valid region 141, a memory region in which a program operation is stopped due to a sudden power off may be set as the invalid region 43. For another example, among the memory regions included in the valid region 141, a memory region in which an error may not be corrected through the ECC unit 133 may be set as the invalid region 143.

The controller 130 may regenerate (change or transfer) any of memory regions included in the invalid region 143 into the valid region 141. That is, the controller 130 may regenerate available regions among the memory regions included in the invalid region 143 into the valid region 141. Hereafter, such an operation of the controller 130 may be defined as an invalid region regeneration operation. The memory regions regenerated into the valid region 141 through the invalid region regeneration operation may be newly mapped to logical addresses through the address mapping, and then used to store data. The memory regions regenerated into the valid region through the invalid region regeneration operation may be programmed to not have any influence of disturbance and interference on other memory regions.

Figure 2:
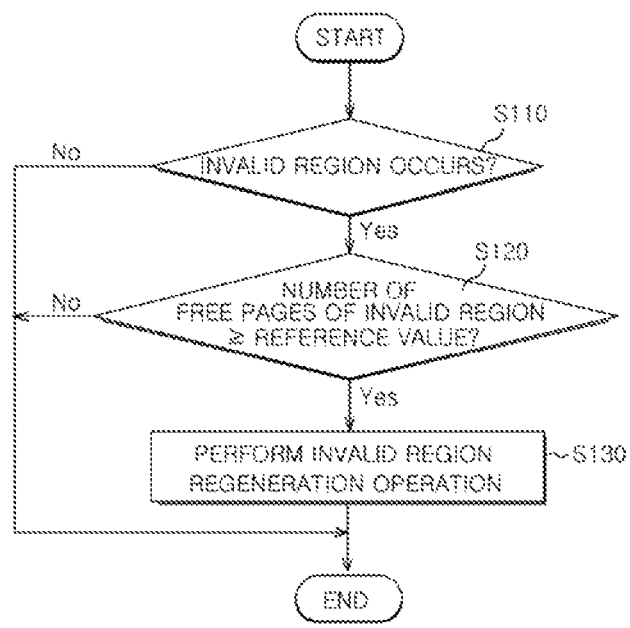
FIG. 2 is a flowchart illustrating an operation of the data storage device shown in FIG. 1 according to an exemplary embodiment of the present invention.
Figure 3:
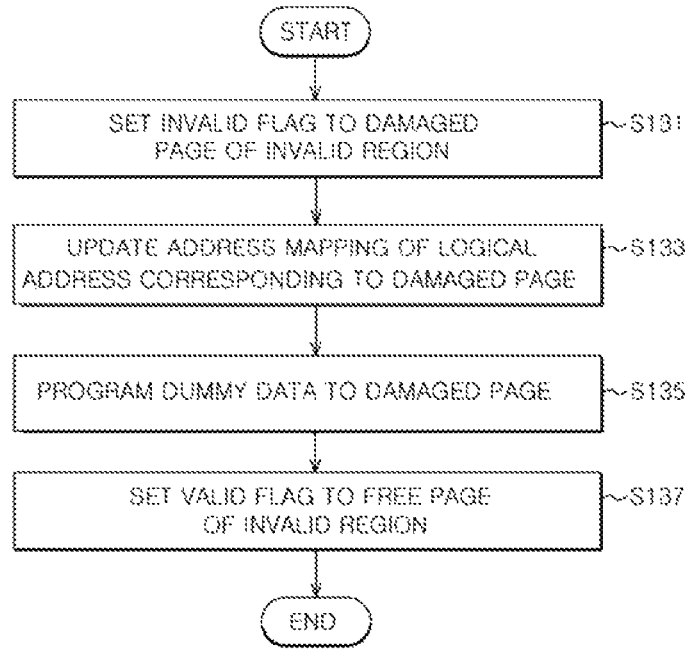
FIG. 3 is a flowchart illustrating an invalid region regeneration operation of FIG. 2.

FIG. 2 is a flowchart illustrating an operation of the data storage device 120 shown in FIG. 1 according to an exemplary embodiment of the present invention. FIG. 3 is a flowchart illustrating an invalid region regeneration operation at step S130 of FIG. 2.

As described above, the valid region 141 and the invalid region 143 of FIG. 1 may be configured by the unit of blocks. Hereafter, a memory block included in the valid region 141 may be referred to as a valid block, and a memory block included in the invalid region 143 may be referred to as an invalid block, for convenience of description. Furthermore, each of the valid block and the invalid block may be configured by the unit of pages.

At step S110, the controller 130 of the data storage device 120 shown in FIG. 1 may determine whether or not an invalid block occurs in memory regions of the flash memory device 140. For example, the controller 130 may determine whether or not a memory block in which stored data are damaged is included in valid blocks. When a valid block in which stored data are damaged is detected, the controller 130 may set the corresponding memory block to an invalid block. When any invalid block does not occur, the procedure may be ended. On the other hand, when an invalid block occurs, the procedure may proceed to step S120.

At step S120, the controller 130 may determine whether the number of free pages in the invalid block is larger than or equal to a reference value. The free page may indicate a page in which data is not stored, that is, an empty page. Alternatively, the free page may indicate a page, which is not used for storing data. For example, the controller 130 may set the number of damaged pages in the invalid block, that is, the number of pages in which stored data are damaged, to the reference value. In this case, the controller 130 may determine whether or not the number of free pages in the invalid block is larger than or equal to the number of damaged pages in the invalid block. When the number of free pages in the invalid block is smaller than the reference value, the procedure may be ended. On the other hand, when the number of free pages in the invalid block is larger than or equal to the number of damaged pages in the invalid block, the procedure may proceed to step S130.

At step S130, the controller 130 may perform an invalid region regeneration operation on the invalid block. The controller 130 may regenerate (change or transfer) available pages included in the invalid block into the valid block of the valid region 141. For example, the controller 130 may regenerate the other pages excluding the damaged pages of the invalid block into the valid region 141. The controller 130 may regenerate the free pages of the invalid block into the valid region 141. The invalid region regeneration operation of the controller 130 will be described in detail with reference to the flowchart of FIG. 3.

At step S131, the controller 130 may set an invalid flag so that the damaged pages of the invalid block are not used any more. Since the damaged pages may not be used in response to the set invalid flag, logical addresses mapped to the damaged pages may be mapped to other physical addresses.

At step S133, the controller 130 may update the address mapping of the logical addresses corresponding to the damaged pages. That is, the controller 130 may update mapping information so that the logical addresses mapped to the damaged pages are mapped to other physical addresses. Through this operation, the damaged pages may not be accessed any more, and invalidated.

At step S135, the controller 130 may program dummy data to the damaged pages. For example, the controller 130 may program the dummy data so that all memory cells of the damage pages have a specific program state. When the dummy data are programmed to the damaged pages, the damaged pages may not have any influence of disturbance and interference on the memory region regenerated through the invalid region regeneration operation.

Figure 4:
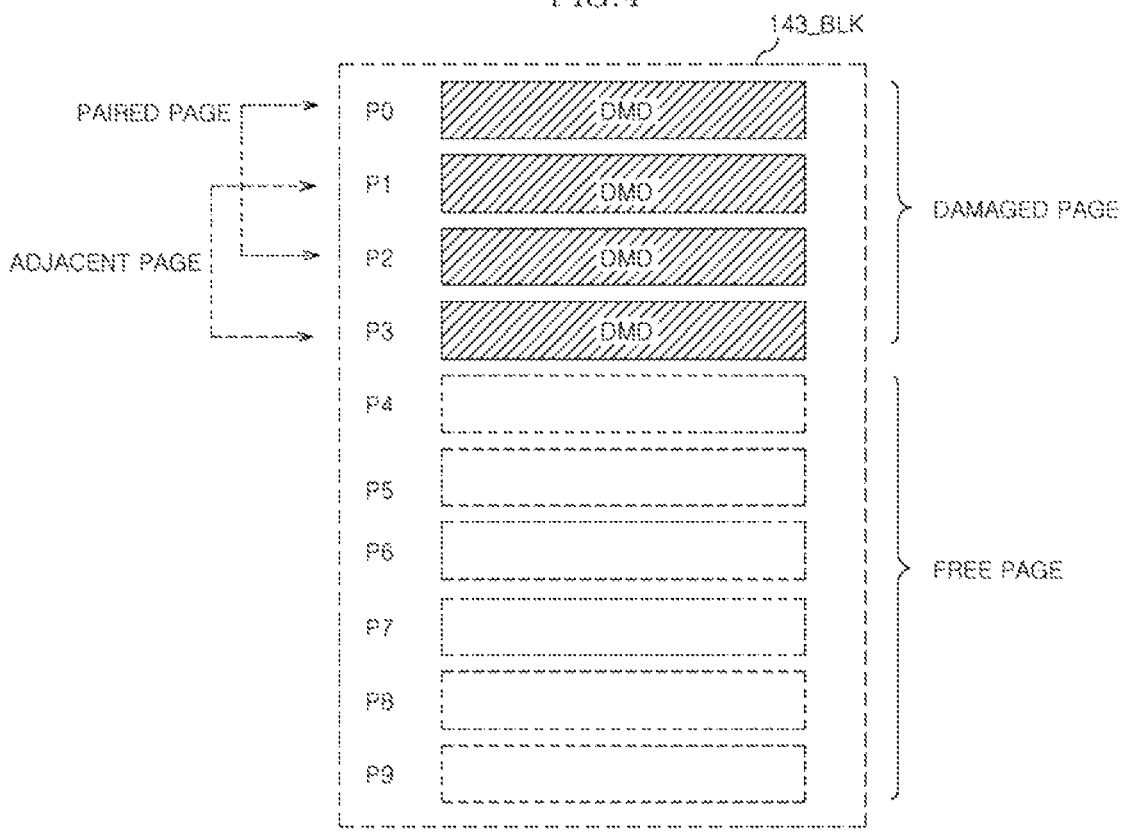
FIG. 4 illustrates an invalid region of the data storage device shown in FIG. 1 to explain an invalid region regeneration operation according to an exemplary embodiment of the present invention.

At step S137, the controller 130 may set a valid flag so that the free pages of the invalid block are used during a subsequent operation. In response to the valid flag, the free pages of the invalid block may be set as the valid region 141, that is, a memory region which may be used to store data. The free pages regenerated into the valid region 141 may be newly mapped to logical addresses during a subsequent operation, FIG. 4 illustrates an invalid region of the data storage device shown in FIG. 1 to explain the invalid region regeneration operation according to an exemplary embodiment of the present invention.

When one or more pages included in a valid block are damaged, the valid block may be set or changed) to an invalid block. FIG. 4 illustrates a memory block 143_BLK, which is set as an invalid block because of a page P2 in which stored data are damaged.

When data stored in memory cells have a correlation with each other and the respective memory cells are programmed to a specific program state according to the correlation, the data stored in the respective memory cells may be paired. Hereafter, the data may be referred to as paired data. Furthermore, pages storing the paired data, respectively, may be paired. Hereafter, the pages may be referred to as paired pages.

The data stored in the paired pages have a correlation with each other. Thus, when any one data is damaged, the other data may be damaged. In this way, when data stored in the page P2 are damaged, the data stored in a page P0 paired with the page P2 may be damaged. Thus, the page P0 may be set as a damaged page by the page P2 in which stored data are damaged.

Data stored in pages P1 and P3 physically adjacent to the page P2 may be damaged due to the influence of disturbance and interference caused by the damaged page P2. For this reason, the pages P1 and P3 may be set as damaged pages.

Among the pages P0 to P9 included in the invalid block 143_BLK, the other pages P4 to P9 excluding the damaged pages P0 to P3 may be set as the invalid region 143, even though no data are stored in the pages P4 to P9. That is, although the free pages P4 to P9 may be used, the free pages P4 to P9 may be set as the invalid region 143. Through the invalid region regeneration operation according to the exemplary embodiment of the present invention, the free pages P4 to P9 of the invalid block 143_BLK, set as the invalid region 143, may be regenerated into the valid region 141 to be used during a subsequent operation.

FIG. 5 illustrates an address mapping table for the invalid region shown in FIG. 4. In particular, FIG. 5 illustrates a change of the address mapping table through the invalid region regeneration operation.

Referring to FIG. 5 an invalid flag IVP may be set as the damaged pages P0 to P3 of the invalid block 143_BLK shown in FIG. 4 so that the damaged paged P0 to P3 are not used any more. Logical addresses LA110, LA114, LA118 and LA122 mapped to the damaged pages P0 to P3 may be mapped to other available physical addresses P303, P304, P305 and P306, respectively. That is, the physical addresses corresponding to the logical addresses LA110, LA114, LA118 and LA122 mapped to the damaged pages P0 to P3 may be updated. Furthermore, a valid flag VP may be set as the regenerated pages of the invalid block 143_BLK, that is, the free pages P4 to P9 so that the free pages P4 to P9 may be used during a subsequent operation.

The damaged pages P0 to P3 may be programmed to store dummy data DMD. The damaged pages P0 to P3 having the dummy data DMD programmed therein may not have any influence of disturbance and interference on the regenerated pages P4 to P9.

Figure 6:
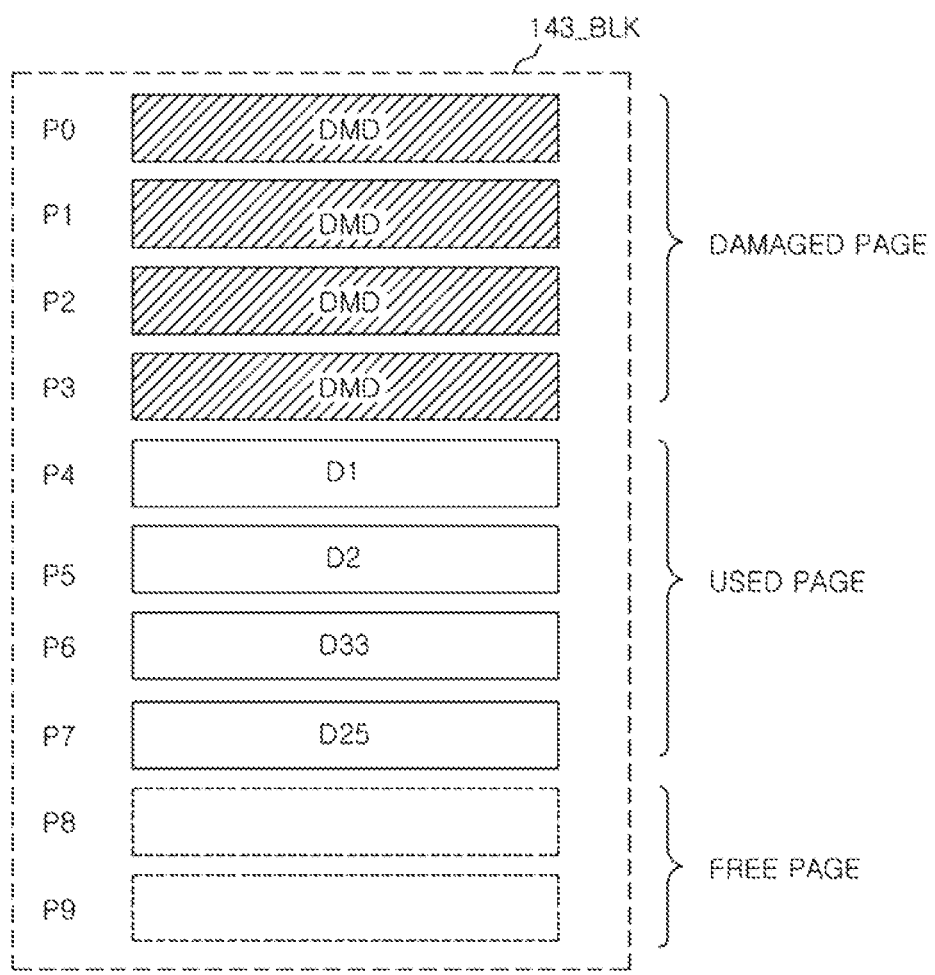
FIG. 6 is a diagram for explaining a region regenerated through an invalid region regeneration operation according to an exemplary embodiment of the present invention.

FIG. 6 is a diagram for explaining a region regenerated through an invalid region regeneration operation according to an exemplary embodiment of the present invention, FIG. 7 illustrates an address mapping table for the regenerated region shown in FIG. 6.

The regenerated pages P4 to P9 regenerated through the invalid region regeneration operation may be used to store data during a subsequent operation. When data are stored in the regenerated pages P4 to P9, the regenerated pages P4 to P9 may be newly mapped to logical addresses according to the valid flag VP. For example, the regenerated pages P4 to P9 to which the valid flag VP is set may be newly mapped to logical addresses.

Referring to FIGS. 6 and 7, the generated page P4 may be mapped to a logical address LA232, and may store data D1. The regenerated page P5 may be mapped to a logical address LA236, and may store data D2. The regenerated page P6 may be mapped to a logical address LA350, and may store data D33. Furthermore, the regenerated page P6 may be mapped to a logical address LA300, and may store data D25. The regenerated pages P8 and P9 regenerated in such a manner may also be used to store data during a subsequent operation.

Figure 8:
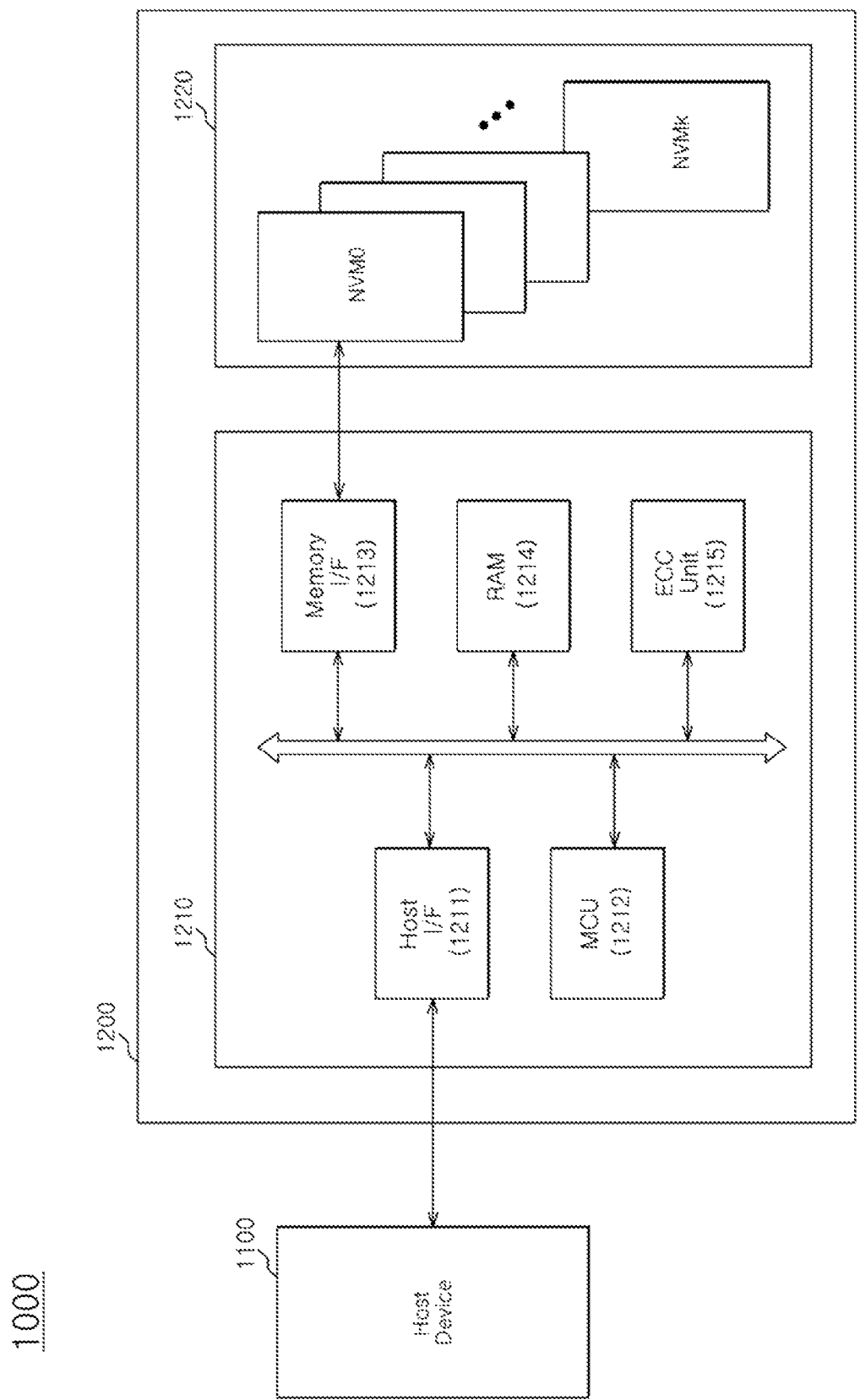
FIG. 8 is a block diagram illustrating a data processing system according to an exemplary embodiment of the present invention.

FIG. 8 is a block diagram illustrating a data processing system according to an exemplary embodiment of the present invention.

Referring to FIG. 8, the data processing system 1000 may include a host device 1100 and a data storage device 1200. The data storage device 1200 may perform an invalid region generation operation according to the exemplary embodiment of the present invention. Thus, the storage capacity of the data storage device 1200 may be increased.

The data storage device 1200 may include a controller 1210 and a nonvolatile memory device 1220. The data storage device 1200 may be coupled to the host device 1100, such as a desktop computer, a notebook computer, a digital camera, a mobile phone, an MP3 player, a game machine, or the like. The data storage device 1200 may be referred to as a memory system.

The controller 1210 may include a host interface 1211, a micro control unit 1212, a memory interface 1213, a RAM 1214, and an ECC unit 1215.

The micro control unit 1212 may control overall operations of the controller 1210 in response to a request from the host device 1100. The RAM 1214 may serve as a working memory of the micro control unit 1212. The RAM 1214 may temporarily store data read from the nonvolatile memory device 1220 or data provided from the host device 1100.

The host interface 1211 may interface the host device 1100 with the controller 1210. For example, the host interface 1211 may communicate with the host device 1100 through one of various interface protocols such as a UFS (Universal Flash Storage) protocol, a USB (Universal Serial Bus) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial Advanced Technology Attachment) protocol, an SCSI (Small Computer System Interface) protocol, and SAS(Serial Attached SCSI) protocol.

The memory interface 1213 may interface the controller 1210 with the nonvolatile memory device 1220. The memory interface 1213 may provide a command and address to the nonvolatile memory device 1220. Furthermore, the memory interface 1213 may exchange data with the nonvolatile memory device 1220.

The ECC unit 1215 may detect errors of the data read from the nonvolatile memory device 1220. Furthermore, the ECC unit 1215 may correct the detected errors, when the number of detected errors falls within a correction range. Meanwhile, the ECC unit 1215 may be provided inside or outside the controller 1210 depending on the memory system 1000.

The controller 1210 and the nonvolatile memory device 1220 may be integrated into one semiconductor device to form various types of data storage devices. For example, the controller 1210 and the nonvolatile memory device 1220 may be integrated into one semiconductor device to form a multimedia card (MMC, eMMC, RS-MMC, or MMC-micro), an SD (secure digital) card (SD, Mini-SD, or Micro-SD), a USB device, a UFS (universal flash storage) device, a PCMCIA (personal computer memory card international association) card, a CF (compact flash) card, a smart media card, a memory stick, or the like.

Figure 9:
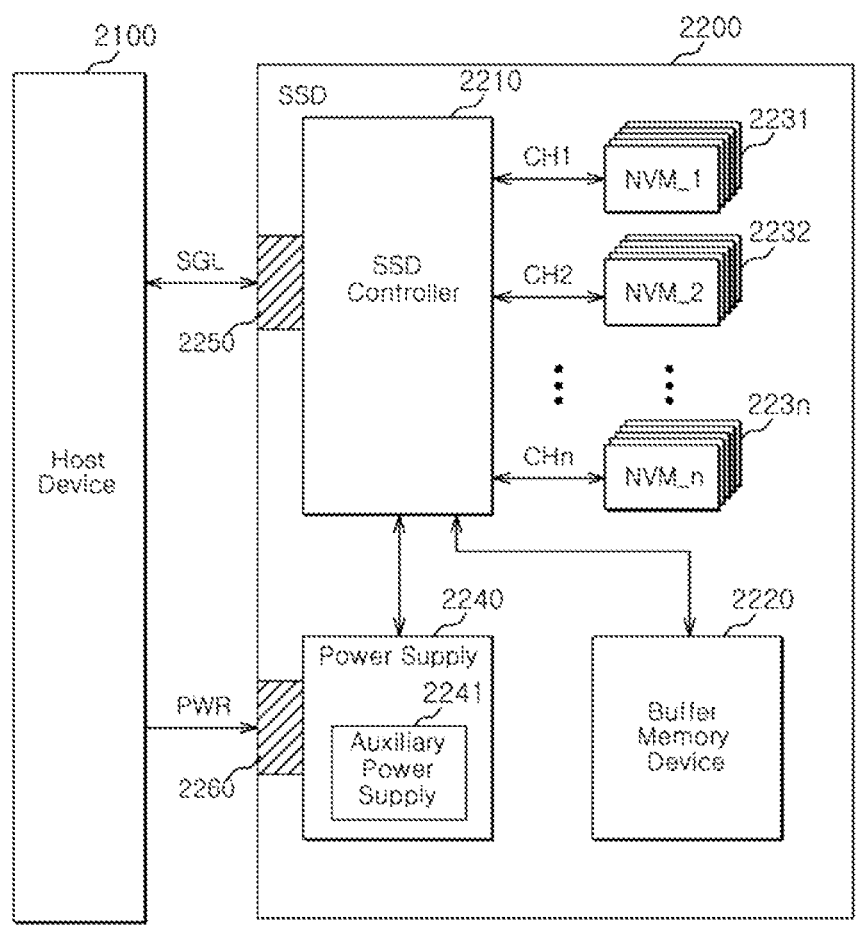
FIG. 9 is a block diagram illustrating an SSD according to an exemplary embodiment of the present invention.

FIG. 9 is a block diagram illustrating an SSD according to an exemplary embodiment of the present invention.

Referring to FIG. 9, a data processing system 2000 includes a host device 2100 and an SSD 2200. The SSD 2200 may perform an invalid region regeneration operation according to the exemplary embodiment of the present invention. Thus, the storage capacity of the SSD 2200 may be improved.

The SSD 2200 may include an SSD controller 2210, a buffer memory device 2220, a plurality of nonvolatile memory devices 2231 to 223*n*, a power supply 2240, a signal connector 2250, and a power connector 2260.

The SSD 2200 may operate in response to a request from the host device 2100. That is, the SSD controller 2210 may access the nonvolatile memory devices 2231 to 223*n* in response to a request from the host device 2100. For example, the SSD controller 2210 may control read, program, and erase operations of the nonvolatile memory devices 2231 to 223*n*. Furthermore, the SSD controller 2210 may perform a dynamic address mapping table backup operation according to the exemplary embodiment of the present invention. Thus, the operation speed of the SSD 2200 may be improved.

The buffer memory device 2220 may temporarily store data which are to be stored in the nonvolatile memory devices 2231 to 223*n*. Furthermore, the buffer memory device 2220 may temporarily store data read from the nonvolatile memory devices 2231 to 223*n*. The data temporarily stored in the buffer memory device 2220 may be transmitted to the host device 2100 or the nonvolatile memory devices 2231 to 223*n*, under the control of the SSD controller 2210.

The nonvolatile memory devices 2231 to 223*n* may serve as storage media of the SSD 2200. The respective nonvolatile memory devices 2231 to 223n may be coupled to the SSD controller 2210 through a plurality of channels CH1 to CHn. One channel may be coupled to one or more nonvolatile memory devices. The nonvolatile memory devices coupled to one channel may be coupled to the same signal bus and data bus.

The power supply 2240 may provide a power PWR inputted through the power connector 2260 into the SSD 2200. The power supply 2240 may include an auxiliary power supply 2241. The auxiliary power supply 2241 may supply power to normally terminate the SSD 2200 when a sudden power off occurs. The auxiliary power supply 2241 may include super capacitors capable of storing the power PWR.

The SSD controller 2210 may exchange signals SGL with the host device 2100 through the signal connector 2250. The signals SGL may include commands, addresses, data, and the like. The signal connector 2250 may include a connector such as PATA (Parallel Advanced Technology Attachment), SATA (Serial Advanced Technology Attachment), SCSI (Small Computer System Interface), SAS (Serial Attached SCSI), PCI (Peripheral Component Interconnection) or PCI-E (PCI Express), according to the interface scheme between the host device 2100 and the SSD 2200.

Figure 10:
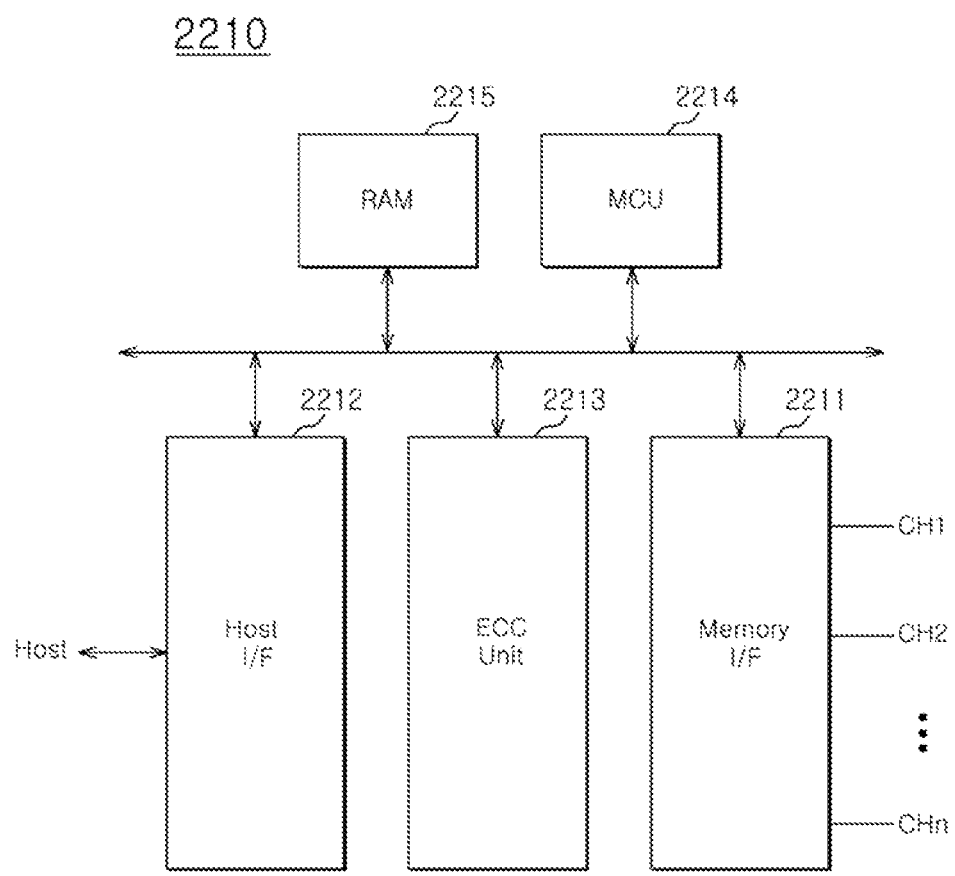
FIG. 10 is a block diagram illustrating an SSD controller illustrated in FIGS. 9.

FIG. 10 is a block diagram illustrating the SSD controller 2210 illustrated in FIG. 9.

Referring to FIG. 10, the SSD controller 2210 may include a memory interface 2211, a host interface 2212, an ECC unit 2213, a micro control unit 2214, and a RAM 2215.

The memory interface 2211 may provide a command and address to the nonvolatile memory devices 2231 to 223n. Furthermore, the memory interface 2211 may exchange data with the nonvolatile memory devices 2231 to 223n. The memory interface 2211 may scatter data transferred from the buffer memory device 2220 over the respective channels CH1 to CHn, under the control of the micro control unit 2214. Furthermore, the memory interface 2211 may transfer data read from the nonvolatile memory devices 2231 to 223n to the buffer memory device 2220, under the control of the micro control unit 2214.

The host interface 2212 may interface the SSD 2200 with the host device 2100 in response to the protocol of the host device 2100. For example, the host interface 2212 may communicate with the host device 2100 through one of PATA (Parallel Advanced Technology Attachment), SATA (Serial Advanced Technology Attachment), SCSI (Small Computer System Interface), SAS (Serial Attached SCSI), PCI (Peripheral Component Interconnection) and PCI-E (PCI Express) protocols. Furthermore, the host interface 2212 may perform a disk emulation function of supporting the host device 2100 to recognize the SSD 2200 as a hard disk drive (HDD).

The ECC unit 2213 may generate parity bits based on the data transmitted to the nonvolatile memory devices 2231 to 223n. The generated parity bits may be stored in spare areas of the nonvolatile memory devices 2231 to 223n. The ECC unit 2213 may detect errors of data read from the nonvolatile memory devices 2231 to 223n. When the number of detected errors falls within a correction range the ECC unit 2213 may correct the detected errors.

The micro control unit 2214 may analyze and may process the signals SGL inputted from the host device 2100. The micro control unit 2214 may control overall operations of the SSD controller 2210 in response to a request from the host device 2100. The micro control unit 2214 may control the operations of the buffer memory device 2220 and the nonvolatile memory devices 2231 to 223n based on firmware for driving the SSD 2200. The RAM 2215 may serve as a memory device for executing the firmware, FIG. 11 is a block diagram illustrating a computer system in which the data storage device according to an exemplary embodiment of the present invention is mounted.

Figure 11:
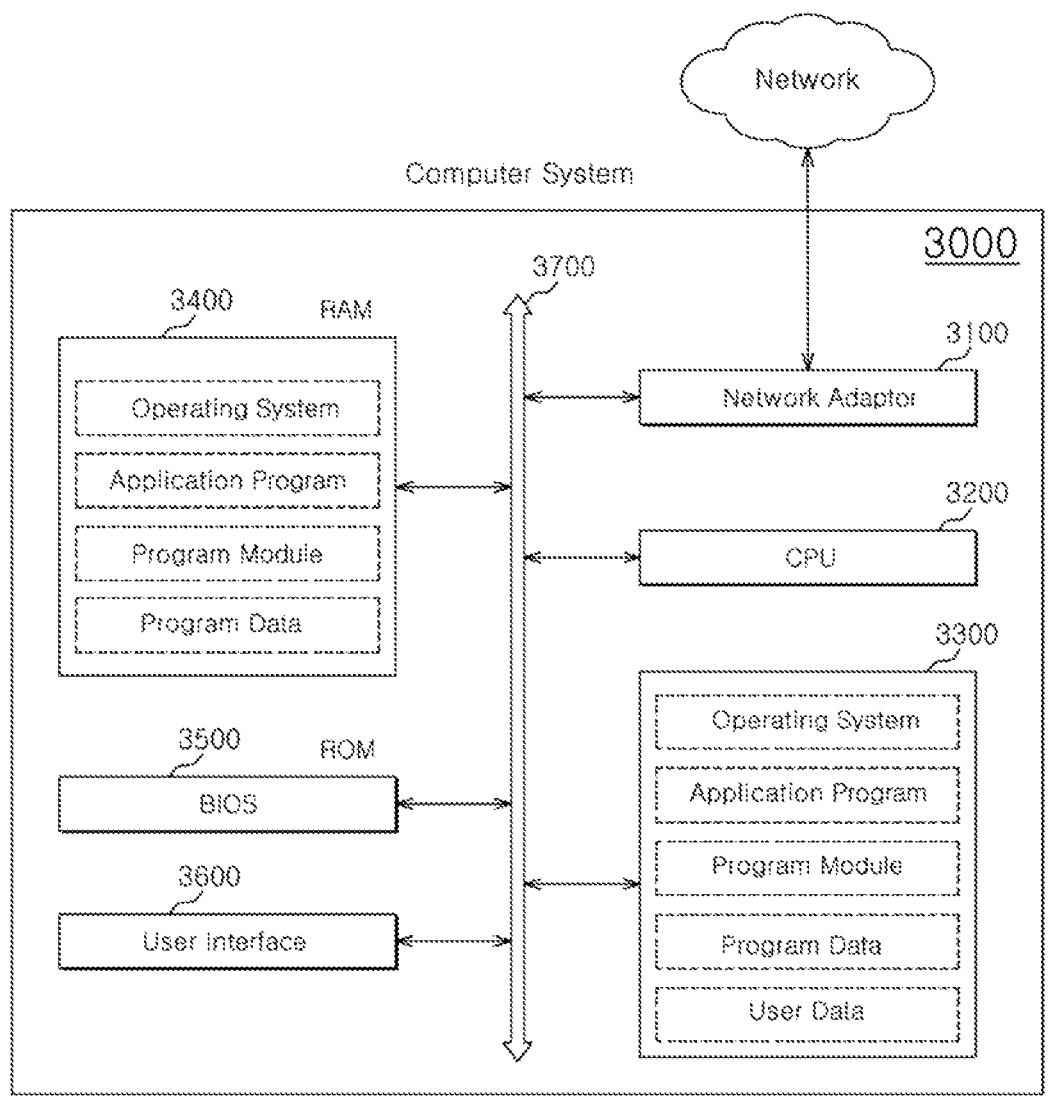
FIG. 11 is a block diagram illustrating a computer system in which a data storage device according to an exemplary embodiment of the present invention is mounted.

Referring to FIG. 11, the computer system 3000 may include a network adapter 3100, a CPU 3200, a data storage device 3300, a RAM 3400, a ROM 3500, and a user interface 3600, which are electrically coupled to the system bus 4700. The data storage device 3300 may include the data storage device 120 illustrated in FIG. 1, the data storage device 1200 illustrated in FIG. 8 or the SSD 2200 illustrated in FIG. 9.

The network adapter 3100 may provide an interface between the computer system 3000 and external networks. The CPU 3200 may perform overall arithmetic operations for driving an operating system or application programs staying in the RAM 3400.

The data storage device 3300 may store overall data required by the computer system 3000. For example, the operating system for driving the computer system 3000, application programs, various program modules, program data, and user data may be stored in the data storage device 3300.

The RAM 3400 may serve as a memory device of the computer system 3000. During booting, the operating system, application programs, various program modules, which are read from the data storage device 3300, and program data required for driving the programs may be loaded into the RAM 3400. The ROM 3500 may store a basic input/output system (BIOS), which is enabled before the operating system is driven. Through the user interface 3600, information exchange may be performed between the computer system 3000 and a user.

Although not illustrated in the drawing, the computer system 3000 may further include a battery, application chipsets, a camera image processor (CIP), and the like.

According to the exemplary embodiments of the present invention, since an invalid region may be recovered, the storage capacity of the data storage device may be improved.

While certain embodiments have been described above, it will be understood to those skilled in the art that the embodiments described are by way of example only. Accordingly, the data storage device described herein should not be limited based on the described embodiments. Rather, the data storage device described herein should only be, limited in light of the claims that follow when taken conjunction with the above description and accompanying drawings.

What is claimed is:

1. An operating method of a data storage device comprising a memory region including a plurality of pages, the operating method comprising:
    determining whether or not the memory region includes damaged pages, and setting the memory region to an invalid region based on the determination result, wherein the invalid region is prevented from storing valid data and the memory region includes at least one of empty page;
    comparing a number of empty pages of the plurality of pages to a reference value; and
    regenerating the empty pages into a valid region depending on a result of the comparison while maintaining the damaged pages as the invalid region, wherein the valid region is allowed to store the valid data.

2. The operating method according to claim 1, wherein the maintaining the damaged pages as the invalid region comprises:

setting an invalid flag to the damaged pages;
mapping a logical address corresponding to damaged data which has been stored in the damaged pages to a physical address of an empty page in the valid region; and
programming dummy data to the damaged pages.

3. The operating method according to claim 2, wherein the regenerating the empty pages further comprises:
setting a valid flag to the empty pages.

4. The operating method according to claim 1, further comprising:
determining whether the number of the empty pages is larger than or equal to the reference value.

5. The operating method according to claim 4, wherein when the number of the empty pages is larger than or equal to the reference value, the regenerating the empty pages is performed.

6. The operating method according to claim 4, wherein the reference value is set as the number of the damaged pages.

7. The operating method according to claim 1, wherein the memory region comprises a plurality of memory blocks, each including a plurality of pages, and
the invalid region is set in unit of memory blocks.

8. The operating method according to claim 7, wherein a memory block including one or more damaged pages in which stored data are damaged is set as the invalid region.

9. The operating method according to claim 1, further comprising:
receiving a write request including the valid data which is to be stored in an empty page in the valid region and a logical address corresponding to the valid data from an external device; and
mapping the logical address to a physical address of the empty page.

10. The operating method according to claim 9, further comprising:
storing the valid data in the empty page.

11. A data storage device comprising:
a nonvolatile memory device comprising a plurality of memory blocks, each including a plurality of pages; and
a controller suitable for controlling an operation of the nonvolatile memory device based on a request from an external device,
wherein the controller determines whether or not a memory block of the plurality of memory blocks includes damaged pages in which stored data are damaged, sets the memory block including the damaged pages to an invalid region, wherein the invalid region is prevented from being mapped to logical addresses provided from the external device and the memory block includes at least one of empty page, and when a number of empty pages of the memory block set as the invalid region is larger than or equal to a reference value, regenerates the empty pages into a valid region, wherein the valid region is allowed to be mapped to the logical addresses, and when the number of the empty pages is smaller than the reference value, maintains all the memory block as the invalid region.

12. The data storage device according to claim 11, wherein the controller sets an invalid flag to the damaged pages, mapping a logical address corresponding to damaged data which has been stored in the damaged pages to a physical address of an empty page in the valid region, and programs dummy data into the damaged pages.

13. The data storage device according to claim 12, wherein the controller sets a valid flag to the empty pages.

14. The data storage device according to claim 11, wherein the controller receives a write request including valid data which is to be stored in an empty page in the valid region and an logical address corresponding to the valid data from the external device and maps the logical address to a physical address of the empty page.

15. The data storage device according to claim 14, wherein the controller stores the valid data in the empty page.

16. The data storage device according to claim 11, wherein the controller determines whether the number of the empty pages of the memory block set as the invalid region is larger than or equal to the reference value.

17. The data storage device according to claim 16, wherein the controller uses a number of the damaged pages in the memory block set as the invalid region as the reference value.

18. An operating method of a data storage device, the operating method comprising:
setting a memory block including a plurality of pages including one or more damaged pages in which stored data are damaged as an invalid block, wherein the invalid block is prevented from storing valid data and the memory region includes at least one of empty page;
determining whether a number of empty pages in the invalid block is larger than or equal to a reference value;
regenerating the empty pages of the invalid block into a valid block when the number of the empty pages is larger than or equal to the reference value, wherein the valid block is allowed to store the valid data; and
maintaining all the memory region as the invalid region when the number of the empty pages is smaller than the reference value,
wherein the damaged pages include an uncorrectable page, one or more paired pages of the uncorrectable page and one or more adjacent pages of the uncorrectable page among the plurality of pages.

19. The operating method according to claim 18, wherein the regenerating the empty pages of the invalid block comprises:
setting an invalid flag to the damaged pages;
programming dummy data to the damaged pages; and
setting a valid flag to the empty pages.

20. The operating method according to claim 18, wherein the uncorrectable page includes a page in which a program operation is stopped due to a sudden power off.

* * * * *